United States Patent
Lehr et al.

(10) Patent No.: US 6,559,547 B1
(45) Date of Patent: May 6, 2003

(54) PATTERNING OF CONTENT AREAS IN MULTILAYER METALIZATION CONFIGURATIONS OF SEMICONDUCTOR COMPONENTS

(75) Inventors: Matthias Uwe Lehr, Dresden (DE); Albrecht Kieslich, Radebeul (DE); Peter Thieme, Dresden (DE); Lars Voland, Dresden (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/663,569

(22) Filed: Sep. 15, 2000

(30) Foreign Application Priority Data

Sep. 15, 1999 (DE) .......................... 199 44 304

(51) Int. Cl.$^7$ .................. H01L 23/48; H01L 23/52; H01L 29/40
(52) U.S. Cl. ...................... 257/760; 257/762
(58) Field of Search ................ 257/760, 762, 257/758; 438/624

(56) References Cited

U.S. PATENT DOCUMENTS

| | | | |
|---|---|---|---|
| 5,494,854 A | * 2/1996 | Jain | 438/692 |
| 5,525,546 A | * 6/1996 | Harada et al. | 438/612 |
| 5,696,030 A | * 12/1997 | Cronin | 257/723 |
| 5,783,488 A | * 7/1998 | Bothra et al. | 438/692 |
| 6,054,376 A | * 4/2000 | Balakrishnan | 438/612 |
| 6,157,083 A | * 12/2000 | Usami et al. | 257/760 |

* cited by examiner

Primary Examiner—Phat X. Cao
(74) Attorney, Agent, or Firm—Laurence A. Greenberg; Werner H. Stemer; Ralph E. Locher

(57) ABSTRACT

The semiconductor structure has a layer structure formed from a metalization layer and a dielectric layer. The metalization layer is patterned and has contact areas. The dielectric layer is composed of a depositable material and covers the metalization layer. The contact areas are formed from many contiguous individual structures, which are so narrow that the depositable material does not form, over the individual structures, any areas which run parallel to the metalization layer. The grid of contiguous individual structures forms a contact area which causes dielectric layer elevations which are particularly low and therefore easy to planarize.

12 Claims, 3 Drawing Sheets

PATTERNING OF CONTENT AREAS IN MULTILAYER METALIZATION CONFIGURATIONS OF SEMICONDUCTOR COMPONENTS

BACKGROUND OF THE INVENTION

Field of the Invention

The invention lies in the field of semiconductor manufacture. More specifically, the invention relates to a semiconductor structure having a layer structure formed from a metalization layer and a dielectric layer. The metalization layer is patterned and has contact areas, and the dielectric layer is composed of a depositable material and covers the metalization layer. Such a semiconductor structure is disclosed, for example, in published Japanese patent application JP 9-289247.

Layer structures of that type are present in many modern semiconductor structures in which components arranged on the substrate surface are connected to one another by a plurality of metal layers lying above them. The metal layers in such multilayer metalizations are insulated from one another by interposed dielectric layers. The interconnect structures of the individual metal planes are connected to one another by so-called vias, for which purpose contact areas are formed in the metal planes. These contact areas are wider than the interconnects themselves and are usually arranged at the edge of the semiconductor structure below bonding pads.

A respective dielectric is deposited as ILD (interlevel dielectric layer) over the patterned metalization planes. The use of inductively coupled high density plasma (HDP) has proved successful for the deposition. Narrow trenches between metalization tracks are also reliably filled thereby without any gaps. In the course of deposition with the aid of the HDP method, elevations of the dielectric are produced over the metalization tracks. These elevations cannot be completely eliminated using planarization methods such as chemical mechanical polishing CMP and thus form fault sources for subsequent process steps. By way of example, coupling capacitances that are difficult to predict arise between adjacent metalization planes. The behavior of the semiconductor structure on carrying out analog functions becomes less predictable. The performance of lithographic techniques is also limited. In particular, DUV lithography in conjunction with metal etching by means of reactive ions (reactive ion etching; RIE) requires high planarity of the dielectric layers.

The dielectric elevations that occur are particularly high over large-area regions of the underlying metalization layer. In particular contact areas, serving, for instance, to interconnect the metalization planes, are covered by a dielectric layer having the full deposition thickness. In contrast to the narrower interconnects, which are covered by a comparatively low wall of the dielectric, the size of the contact areas cannot be arbitrarily reduced because the vias that are to be introduced over them into the dielectric must be connected unerringly to the contact area despite any exposure faults.

Therefore, the dielectric is deposited on the comparatively large contact area with the same deposition thickness as between the interconnects. The resulting elevations lead to the above-mentioned disadvantages.

SUMMARY OF THE INVENTION

The object of the invention is to provide a semiconductor structure which overcomes the above-noted deficiencies and disadvantages of the prior art devices and methods of this general kind, and wherein these elevations are largely avoided without the size of the contact areas having to be reduced and the latter then leading to fault sources in the course of via contacting. p With the above and other objects in view there is provided, in accordance with the invention, a semiconductor layer structure, comprising:

a patterned metalization layer having contact areas formed of a plurality of contiguous individual structures;

a dielectric layer formed of deposited material covering the metalization layer;

the individual structures of the contact areas having a width reduced to such a degree that the deposited material does not form, over the individual structures, any areas running parallel to the metalization layer.

In other words, the objects of the invention are achieved by forming the-contact areas from many contiguous individual structures, and that the individual structures are so narrow that the depositable material does not form, over the individual structures, any areas which run parallel to the metalization layer. Each elevation over a metalization web has two inclined sidewalls, which, in the case of narrow webs, converge above the center thereof or, in the case of wide webs, bound a surface which is parallel to the substrate and the metalization plane. The height of this surface above the web corresponds to the deposition thickness. The invention exploits the fact that narrow webs are covered by roof-shaped elevations which are shallow in comparison with the deposition thickness. If the conventionally solid contact area is formed by a grid or network of contiguous individual structures, for instance lines, then the trenches or openings in between are filled with the dielectric. The contact-hole-forming grid of interconnects is covered merely by a shallow grid of low elevations of the dielectric, which are easier to planarize than solid elevations and, under certain circumstances, need not be removed on account of their small height. Since the individual structures are contiguous, the function of the grid as contact area remains unimpaired.

The additional width of the individual structures is determined by the angle between the sidewalls of the elevations and the substrate metalization plane. According to the invention, the individual structures are so narrow that the sidewalls of the elevations of the dielectric abut one another and are thus lower than the thickness with which the dielectric is deposited over trenches.

In accordance with an added feature of the invention, the dielectric layer is deposited between the individual structures at a given deposition thickness, and the width of the individual structures is less than twice the given deposition thickness. This limiting width corresponds to a sidewall angle of 45°. A further embodiment provides for the width of the individual structures to correspond to the structure width with which the semiconductor structure is fabricated. As a result, the elevations over the contact areas are kept as low as possible.

Further embodiments directed at the grid structure of the contact areas provide for the individual structures to form a grating of parallel line structures or a network of intersecting line structures.

The dielectric layer is preferably a layer deposited by means of a high density plasma. The metalization layer preferably contains aluminum or else copper.

In accordance with another feature of the invention, further layer structures comprising metalization layers and dielectric layers are arranged above and/or below the above-noted layer structure. The metalization layers form a multilayer metalization configuration. The contact areas of the metalization layers are preferably arranged below bonding pads. In a preferred embodiment, the semiconductor structure is an embedded DRAM.

The individual planes of a multilayer metalization configuration are connected by means of the vias introduced into the interposed dielectric layers. The contact areas are generally situated at the edge of a semiconductor substrate, generally below bonding pads. With this arrangement, the invention affords the additional advantage that continuous oxide supports reaching as far as the substrate are formed below the bonding pads (which are formed by the topmost metalization layer and therefore need not be patterned). In conventional semiconductor structures, below the bonding pads, due to the alternate sequence of solid metal contact areas and oxide layers, there is the risk of breaking under the pressure of the bonding wire to be emplaced. Even when test needles are placed onto the individual contact areas for test purposes, cracking often occurs under the pressure of the test needle. By virtue of the dielectric-filled contact areas patterned according to the invention, the pressure is transmitted through the contact areas to the substrate; fractures no longer occur. The use of the present invention is appropriate particularly in the case of embedded DRAMs, which, under certain circumstances, have a few hundred bonding pads with contact area stacks situated underneath.

Other features which are considered as characteristic for the invention are set forth in the appended claims.

Although the invention is illustrated and described herein as embodied in a patterning of contact areas in multilayer metalization configurations of semiconductor components it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
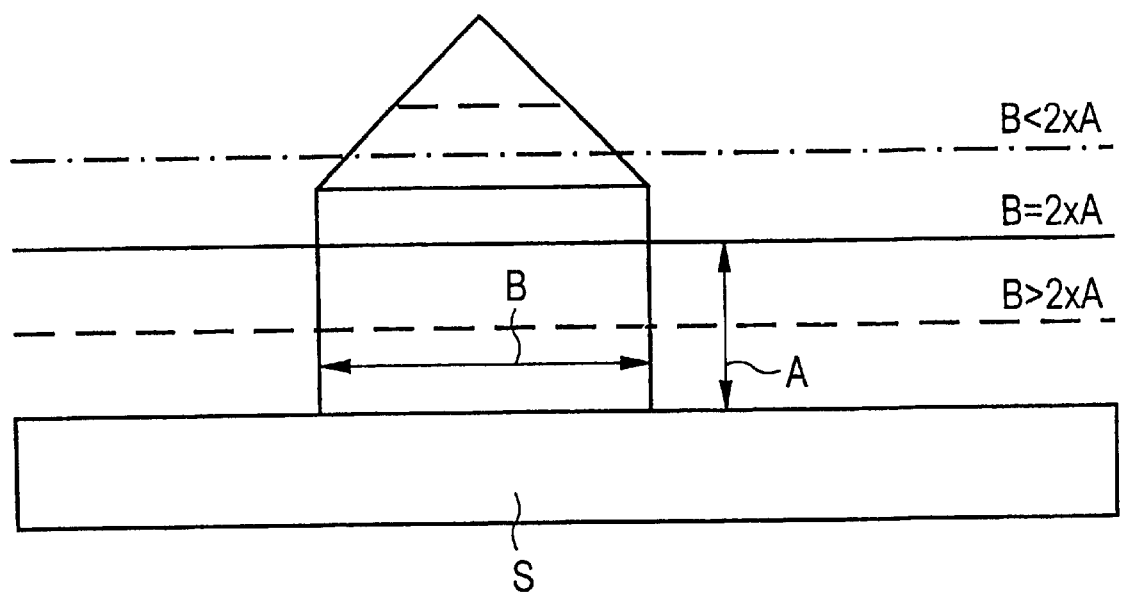
FIG. 1 is a diagrammatic view of HDP deposition profiles for a variable deposition thickness.

Referring now to the figures of the drawing in detail and first, particularly, to FIG. 1 thereof, there are illustrated deposition profiles corresponding to different deposition thicknesses A using an individual structure arranged on a substrate S and having a width B. Assuming a sidewall angle of 45°, the right-hand and left-hand sidewalls of the deposited elevation of the dielectric meet precisely at a deposition thickness of half the width of the structure (solid line B=2×2A). For smaller deposition thicknesses in comparison with the structure width B, an elevation bounded by an area running parallel to the substrate surface is produced over the structure (broken line B>2×2A). If the deposition thickness is greater than half the structure width, an elevation having abutting sidewalls is once again produced but, owing to the thicker deposition in the trenches, the elevation projects with a smaller height out of the contour of the dielectric (dash-dotted line B<2×A).

Figure 2:
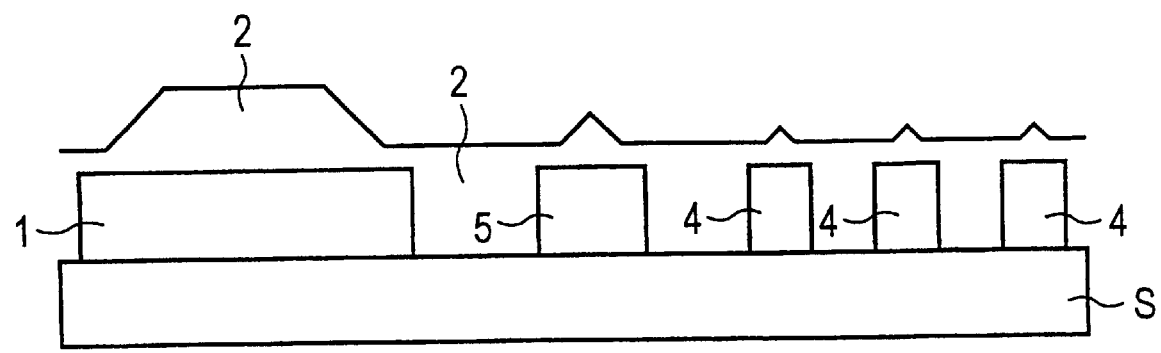
FIG. 2 is a diagrammatic view showing deposition profiles for a variable structure width.

In the case of the deposition of the dielectric on the metalization plane, the deposition thickness is always chosen to be greater than the structure height of the metalization tracks. The resulting structure profile for metalization tracks of different widths is illustrated in FIG. 2. A patterned metalization layer 1 and a dielectric layer 2 deposited thereon are applied on the substrate S. The metalization layer has a solid contact area 1, a narrow interconnect 5 and a grating made of three narrow interconnects 4. An elevation whose height corresponds to the deposition thickness and which projects by approximately 80% of the deposition thickness above the surface of the trench filling is produced over the wide, solid contact area 1. The distinctly narrower interconnect 5 is covered by an elevation whose sidewalls are elevated by approximately one-third of the deposition thickness above the trench filling. The even narrower interconnects 4 cause extremely small elevations when the dielectric is deposited. The latter elevations are even easier to planarize, if this is necessary at all.

Figure 3:
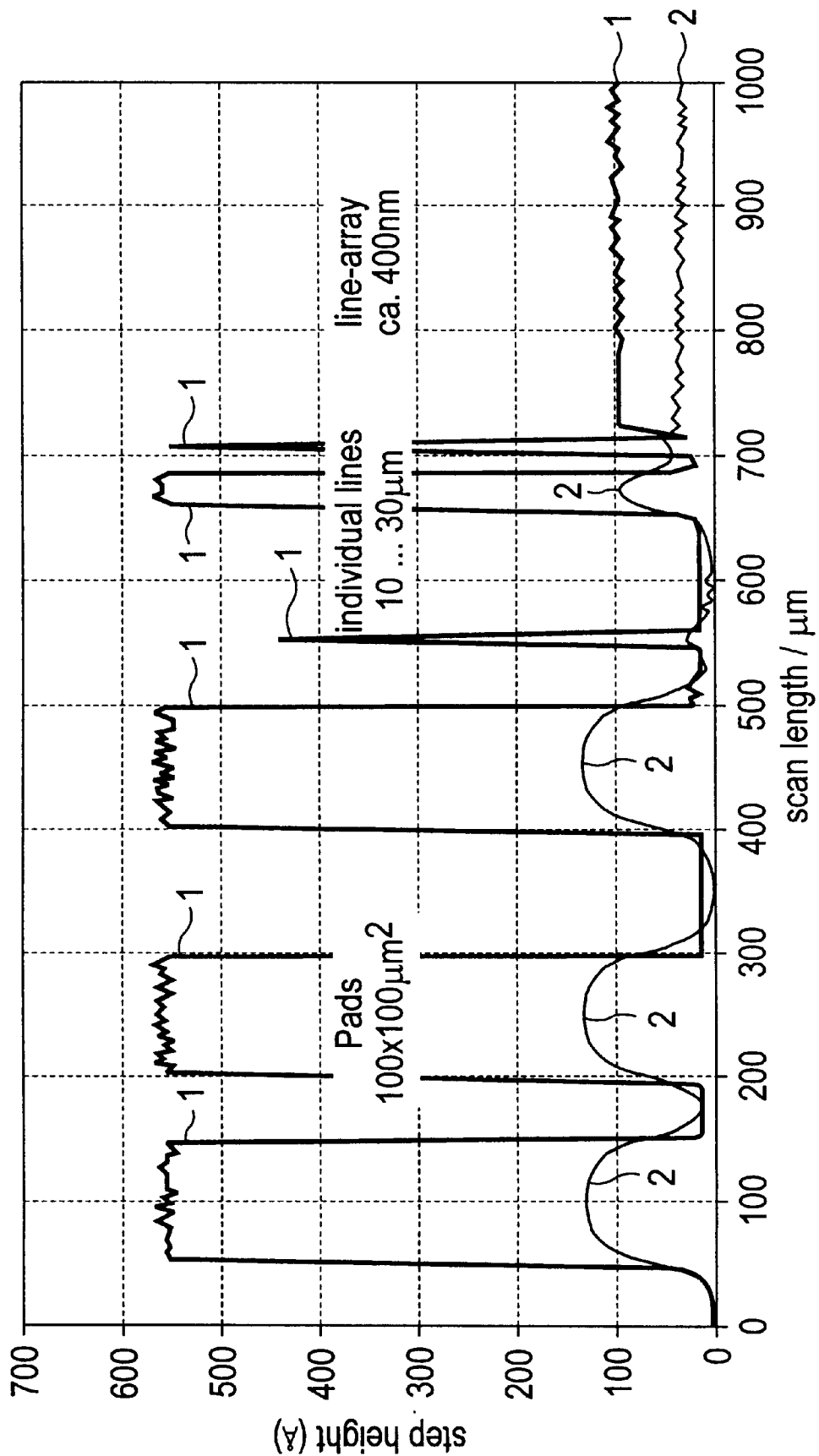
FIG. 3 is a graph showing height profiles of structures having different widths before and after chemical mechanical polishing.
Figure 4B:
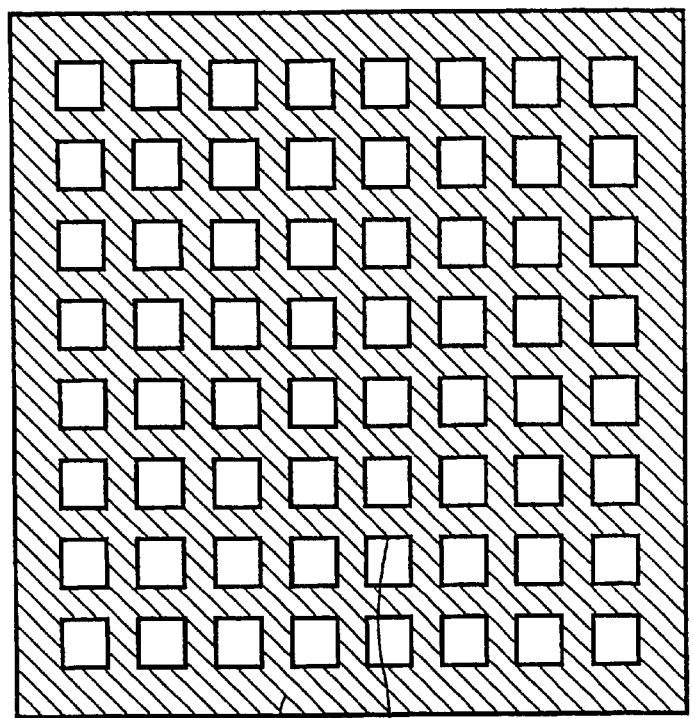
FIGS. 4A and 4B are plan views showing examples of filling structures of the contact areas.
Figure 4A:
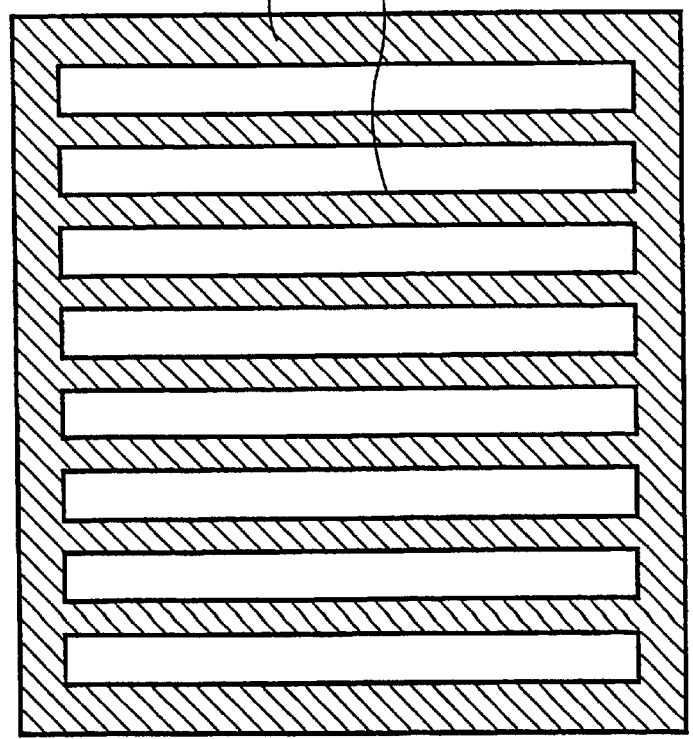

The dielectric surface contour illustrated schematically in FIG. 2 is illustrated for various actual structure widths in FIG. 3. Measured step heights after HDP deposition, i.e. before planarization, and after planarization by chemical mechanical polishing are plotted. It is evident that before planarization, interconnects having a structure width of above approximately 10 $\mu$m) cause elevations which are almost just as high as those caused by wide contact areas of e.g. 0.1 mm. Narrow lines having a width of approximately 400 nanometers produce—even arranged close together—an elevation having a height merely of 100 nm (0.1 $\mu$m) compared with about 550 nm (0.55 $\mu$m) in the case of wide structures. This step can be almost completely removed by planarization, whereas wider structures can be planarized merely down to residual elevations having a height of up to 120 nm (0.12 $\mu$m). The almost complete planarizability of the grid of lines having a width of 400 nanometers is also a consequence of the fact that not only small but also isolated elevations occur over this grid. Said elevations are easier to planarize than a compact elevation extending over a large base area. As examples of a grid arrangement of such narrow interconnects, FIG. 4 shows a grating of parallel line structures 4 and a network of intersecting line structures, in each case surrounded by a frame 6.

We claim:

1. A semiconductor layer structure, comprising:
   a patterned metalization layer having a contact area formed of a plurality of contiguous individual structures;
   a dielectric layer formed of deposited material covering said metalization layer;
   said individual structures of said contact area having a width reduced to such a degree that said deposited material does not form, over said individual structures, any surfaces running parallel to said metalization layer.

2. The semiconductor structure according to claim 1, wherein said dielectric layer is deposited between said individual structures at a given deposition thickness, and said width of said individual structures is less than twice the given deposition thickness.

3. The semiconductor structure according to claim 1, wherein the semiconductor structure is fabricated with a defined structure width, and said width of said individual structures corresponds to the defined structure width.

4. The semiconductor structure according to claim 1, wherein said individual structures of said contact area form a grating of mutually parallel line structures.

5. The semiconductor structure according to claim 1, wherein said individual structures of said contact area form a network of intersecting line structures.

6. The semiconductor structure according to claim 1, wherein said dielectric layer is a layer deposited by high density plasma (HDP) deposition.

7. The semiconductor structure according to claim 1, wherein said metalization layer contains at least one metal selected from the group consisting of aluminum and copper.

8. The semiconductor structure according to claim 1, wherein said metalization layer and said dielectric layer together form a first layer structure, and further layer structures comprising metalization layers and dielectric layers are disposed adjacent said first layer structure, said metalization layers forming a multilayer metalization configuration.

9. The semiconductor structure according to claim 8, wherein said further layer structures are disposed above and below said first layer structure.

10. The semiconductor structure according to claim 1, wherein said contact area is disposed below bonding pads.

11. The semiconductor structure according to claim 1, wherein said metalization layer is a metalization layer of an embedded DRAM.

12. The semiconductor structure according to claim 1, wherein said patterned metalization layer has one single contact area formed of a plurality of contiguous individual structures.

* * * * *